(12) United States Patent
Sissom et al.

(10) Patent No.: US 11,994,679 B2
(45) Date of Patent: May 28, 2024

(54) RGB ILLUMINATOR SYSTEM HAVING CURVED SURFACES

(71) Applicant: Magic Leap, Inc., Plantation, FL (US)

(72) Inventors: Bradley Jay Sissom, Boulder, CO (US); Clinton Carlisle, Parkland, FL (US)

(73) Assignee: Magic Leap, Inc., Plantation, FL (US)

( * ) Notice: Subject to any disclaimer, the term of this patent is extended or adjusted under 35 U.S.C. 154(b) by 755 days.

(21) Appl. No.: 17/125,958

(22) Filed: Dec. 17, 2020

(65) Prior Publication Data

US 2021/0172582 A1 Jun. 10, 2021

Related U.S. Application Data

(63) Continuation of application No. PCT/US2019/037757, filed on Jun. 18, 2019.

(Continued)

(51) Int. Cl.
| | |
|---|---|
| *G02B 27/30* | (2006.01) |
| *F21V 5/04* | (2006.01) |
| *F21V 7/06* | (2006.01) |
| *F21V 9/08* | (2018.01) |
| *F21V 13/04* | (2006.01) |

(Continued)

(52) U.S. Cl.
CPC .......... *G02B 27/0172* (2013.01); *F21V 5/043* (2013.01); *F21V 7/06* (2013.01); *F21V 9/08* (2013.01); *F21V 13/04* (2013.01); *G02B 27/0966* (2013.01); *G02B 27/0983* (2013.01); *G02B 27/30* (2013.01); *F21Y 2115/30* (2016.08); *G02B 2027/011* (2013.01); *G02B 2027/0112* (2013.01)

(58) Field of Classification Search
CPC ................ G02B 27/30; G03B 21/2033; G03B 21/2013; H04N 9/3152; H04N 9/3161; F21V 5/043

See application file for complete search history.

(56) References Cited

U.S. PATENT DOCUMENTS 6,975,465 B1 * 12/2005 Chung ............... G02B 19/0028
359/638
9,671,566 B2    6/2017 Abovitz et al.
(Continued)

FOREIGN PATENT DOCUMENTS

WO     2011094947 A1    8/2011
WO     2019246115 A1    12/2019

OTHER PUBLICATIONS

PCT/US2019/037757, "International Preliminary Report on Patentability", dated Dec. 30, 2020, 9 pages.
(Continued)

*Primary Examiner* — Ryan D Howard
(74) *Attorney, Agent, or Firm* — KILPATRICK TOWNSEND & STOCKTON LLP

(57) ABSTRACT

An optical device includes two or more light sources configured for providing input light beams having different wavelengths. The optical device also has a curved reflective element configured to receive the input light beams to provide two or more reflected light beams. The optical device also has a cylindrical lens for each of the reflected light beams configured to transmit each of the reflected light beams to provide a corresponding collimated output light beam.

20 Claims, 10 Drawing Sheets

Related U.S. Application Data

(60) Provisional application No. 62/686,474, filed on Jun. 18, 2018.

(51) Int. Cl.
  *G02B 27/01* (2006.01)
  *G02B 27/09* (2006.01)
  *G03B 21/20* (2006.01)
  *F21Y 115/30* (2016.01)

(56) References Cited

U.S. PATENT DOCUMENTS

| | | |
|---|---|---|
| 2006/0061846 A1 | 3/2006 | Sprague et al. |
| 2010/0309569 A1 | 12/2010 | Ricks et al. |
| 2016/0327789 A1 | 11/2016 | Klug et al. |
| 2019/0121139 A1* | 4/2019 | Dykaar ............... H01S 5/02257 |

OTHER PUBLICATIONS

PCT/US2019/037757, "International Search Report and Written Opinion", dated Sep. 10, 2019, 10 pages.

\* cited by examiner

| Color | Peak optical output | Average optical output* | Average electrical power* |
|---|---|---|---|
| Red | 130 mW | 65 mW | 330 mW |
| Green | 185 mW | 46 mW | 600 mW |
| Blue | 115 mW | 29 mW | 141 mW |

FIG. 5

RGB ILLUMINATOR SYSTEM HAVING CURVED SURFACES

CROSS-REFERENCES TO RELATED APPLICATIONS

This application is a continuation of International Patent Application No. PCT2019/037757, filed Jun. 18, 2019, entitled "RGB ILLUMINATOR SYSTEM HAVING CURVED SURFACES," which claims the benefit of and priority to U.S. Provisional Patent Application No. 62/686,474, filed Jun. 18, 2018, entitled "RGB ILLUMINATOR SYSTEM HAVING CURVED SURFACES," the contents of which are hereby incorporated by reference in their entirety.

BACKGROUND OF THE INVENTION

Modern computing and display technologies have facilitated the development of systems for so-called "virtual reality" or "augmented reality" experiences, where digitally produced images are presented in a wearable device to a user in a manner where they seem to be, or may be perceived as, real. A virtual reality, or "VR," scenario typically involves presentation of digital or virtual image information without transparency to other actual real-world visual input; an augmented reality, or "AR," scenario typically involves presentation of digital or virtual image information as an augmentation to visualization of the actual world around the user.

The wearable device may include augmented and/or virtual reality glasses. The image can be displayed using image frames or raster scanned images. In these display devices, optical combiners are often used to combine light beams from different light sources. For example, red, green, and blue light beams can be combined to form a collimated combined colored light beam for displaying an image. Conventional optical combiners made with glass lenses, mirrors, and prisms can be bulky and heavy. They are undesirable for wearable device in VR or AR applications.

Therefore, improved structures and methods for optical combiners are highly desirable.

SUMMARY OF THE INVENTION

Embodiments of the present invention provide methods and systems for RGB (Red Green Blue) illuminators that are compact and light weight compared with conventional systems. In some embodiments, a single curved reflective element is used in conjunction with a cylindrical lens to provide collimated illumination having a plurality of wavelengths. As compared with a system that can utilize a plurality of right angle prisms, embodiments of the invention have a reflective element that is not only a single reflective surface for all channels of a laser package that provide light beams of different wavelengths or colors, but further has a curved surface as opposed to a linear surface or a surface to reflect each channel at a common angle (e.g., 90 degrees). Such a configuration enables smaller beam diameters per channel as compared to a linear reflector, thereby further enabling a single cylinder lens per channel to deliver the light, as opposed to alternative optical lenses necessary to support wider beam diameters that in turn may produce aberrations requiring additional optical components, resulting in large and complex optical systems.

According to some embodiments of the invention, an optical device includes two or more light sources configured for providing input light beams having different wavelengths, a curved reflective element configured to receive the input light beams to provide two or more reflected light beams, and a cylindrical lens configured to transmit a respective one of the reflected light beams to provide a corresponding collimated output light beam.

In some embodiments, each of the input light beams is configured to impinge on the curved reflective element in different regions.

In some embodiments, the curved reflective element is configured to have discrete prescriptions in incidence locations on the curved reflective element for each of the input light beams.

In some embodiments, the optical device can include a first light source configured to emit a first input light beam, a second light source configured to emit a second input light beam, and a third light source configured to emit a third input light beam. The curved reflective element is configured to receive the first input light beam and provide a first reflected light beam, receive the second input light beam and provide a second reflected light beam, and receive the third input light beam and provide a third reflected light beam. A first cylindrical lens is disposed in a first light path of the first reflected light beam to receive the first reflected light beam and provide a first collimated output light beam. A second cylindrical lens is disposed in a second light path of the second reflected light beam to receive the second reflected light beam and provide a second collimated output light beam. A third cylindrical lens is disposed in a third light path of the third reflected light beam to receive the third reflected light beam and provide a third collimated output light beam.

In some embodiments, the first light source is a red laser light source, the second light source is a green laser light source, and the third light source is a blue laser light source.

In some embodiments, the first input light beam, the second input light beam, and the third input light beam are configured to impinge on or impact the curved reflective element in different regions.

In some embodiments, the curved reflective element has a single prescription in different regions.

In some embodiments, the curved reflective element is configured to have discrete prescriptions in incidence locations on the curved reflective element for the first input light beam, the second input light beam, and the third input light beam, respectively.

In some embodiments, the curved reflective element has a parabolic surface contour.

In some embodiments, the curved reflective element has an elliptical surface contour.

In some embodiments, the curved reflective element has a hyperbolic surface contour.

In some embodiments, the curved reflective element has a prescription described by:

$$z = cy^2 / 1 + \sqrt{1-(1+k)c^2y^2} + a_1 y^2 + a_2 y^4 + a_3 y^6 + a_4 y^8 + a_5 y^{10} + a_6 y^{12}$$

wherein c is a curvature of a base radius, k is a conic constant (for parabola=−1), and coefficients α are polynomial aspheric coefficients.

In some embodiments, the curved reflective element has a uniform surface finish.

In some embodiments, the curved reflective element has a discrete surface finishing in each region of the curved reflective element.

According to some embodiments, a method for generating illumination having a plurality of wavelengths is provided. The method includes providing a curved reflective element, providing two or more cylindrical lenses, receiving input light beams having different wavelengths from two or more light sources at the curved reflective element to provide two or more reflected light beams, and transmitting each of the two or more reflected light beams through a respective cylindrical lens to provide a corresponding collimated output light beam.

In some embodiments, each of the input light beams is configured to impinge on the curved reflective element in different regions.

In some embodiments, the method includes directing each of the input light beams to impinge on the curved reflective element in different regions.

In some embodiments, the method includes receiving a first input light beam from a first light source, using the curved reflective element, and providing a first reflected light beam. The method also includes receiving a second input light beam from a second light source using the curved reflective element, and providing a second reflected light beam. The method also includes receiving a third input light beam, a third light source using the curved reflective element, and providing a third reflected light beam. The method includes transmitting the first reflected light beam through a first cylindrical lens to provide a first collimated output light beam, transmitting the second reflected light beam through a second cylindrical lens to provide a second collimated output light beam, and transmitting the third reflected light beam through a third cylindrical lens to provide a third collimated output light beam.

In some embodiments, the method includes emitting a red light beam from the first light source, emitting a green light beam from the second light source, and emitting a blue light beam from the third light source.

In some embodiments, the method also includes directing the first input light beam, the second input light beam, and the third input light beam to impinge on or impact the curved reflective element in different regions.

In some embodiments, the method also includes configuring the curved reflective element to have a single prescription in different regions.

In some embodiments, the method also includes configuring the curved reflective element to have discrete prescriptions in incidence locations on the curved reflective element for the first input light beam, the second input light beam, and the third input light beam, respectively.

In some embodiments, the curved reflective element has an elliptical surface contour.

In some embodiments, the curved reflective element has a parabolic surface contour.

In some embodiments, the curved reflective element has a prescription described by:

$$z = cy^2 / 1 + \sqrt{1-(1+k)c^2y^2} + \alpha_1 y^2 + \alpha_2 y^4 + \alpha_3 y^6 + \alpha_4 y^8 + \alpha_5 y^{10} + \alpha_6 y^{12}$$

wherein c is a curvature of a base radius, k is a conic constant (for parabola=−1), and coefficients α are polynomial aspheric coefficients.

In some embodiments, the method also includes applying a uniform surface finish to the curved reflective element.

In some embodiments, the method also includes applying a discrete surface finishing in each region of the curved reflective element.

Additional features, benefits, and embodiments are described below in the detailed description, figures, and claims.

BRIEF DESCRIPTION OF THE DRAWINGS

FIG. 5 is a simplified diagram illustrating an example of power distribution of different light sources providing light beams of different wavelengths according to embodiments of the present invention;

DETAILED DESCRIPTION OF SPECIFIC EMBODIMENTS

Embodiments of the present invention are directed to optical illuminators for providing light beams from multiple light sources for a wearable device.

In some embodiments, the light patterns generated by the illuminator described herein are coupled into one or more planar waveguides having a structure similar to that proposed for use in augmented reality. A description of a device for creating an augmented reality using such waveguides can be found in U.S. patent application Ser. No. 15/146,296, having a priority date of May 4, 2015 and U.S. patent application Ser. No. 14/331,218, having a priority date of Jul. 12, 2013, the disclosures of each of which are hereby incorporated by reference in their entirety.

Figure 1:
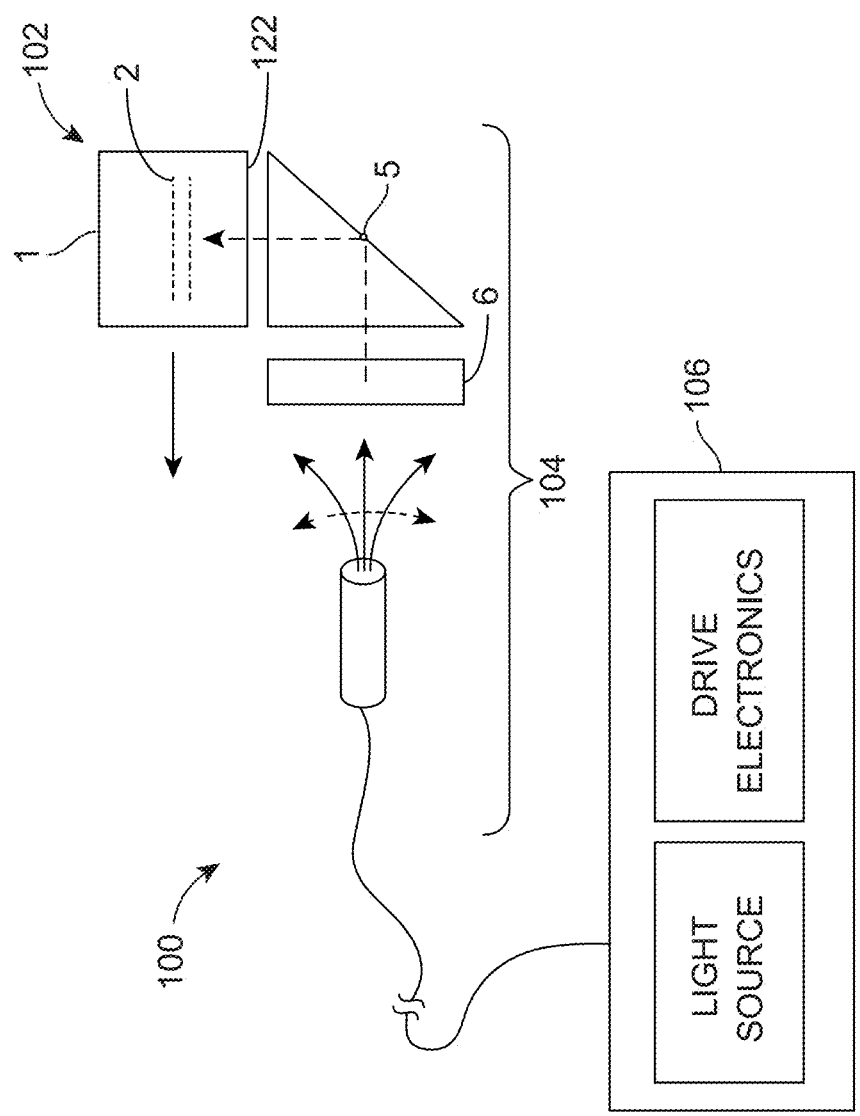
FIG. 1 is a simplified block diagram illustrating an optical system according to some embodiments of the present invention.

FIG. 1 a simplified block diagram illustrating an optical system according to some embodiments of the present invention. As shown in FIG. 1, an optical system 100 can include a waveguide apparatus 102 that includes a planar waveguide 1. The planar waveguide is provided with one or more diffractive optical elements (DOEs) 2 for controlling the total internal reflection of the light within the planar waveguide. The optical system further includes an optical coupler subsystem 104 and a control subsystem 106, as described further below.

Figure 2:
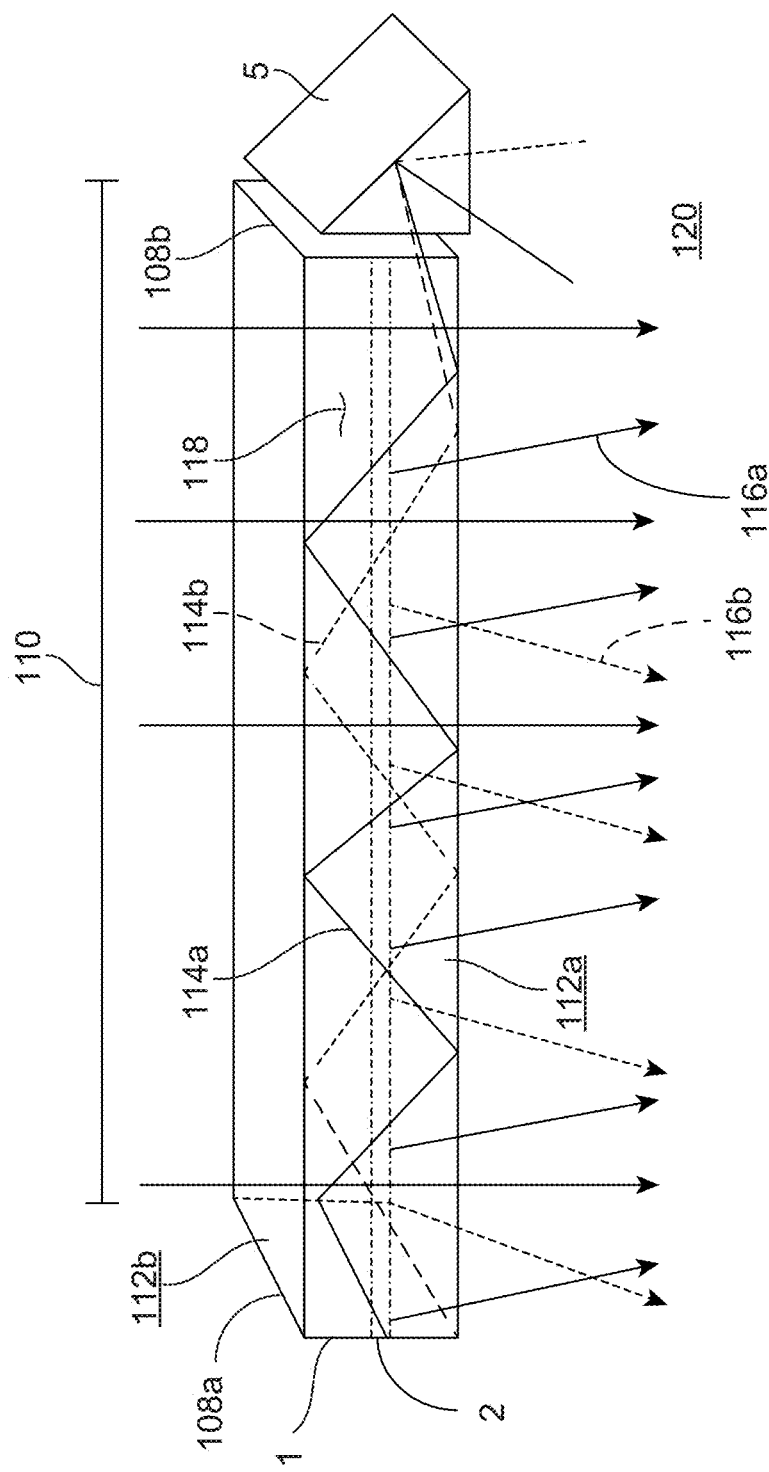
FIG. 2 is a simplified schematic diagram illustrating a planar waveguide according to some embodiments of the present invention.

FIG. 2 is a simplified schematic diagram illustrating a planar waveguide according to some embodiments of the present invention. As illustrated in FIG. 2, the planar waveguide 1 has a first end 108a and a second end 108b, the second end 108b opposed to the first end 108a along a length 110 of the planar waveguide 1. The planar waveguide 1 has a first face 112a and a second face 112b, at least the first and the second faces 112a, 112b (collectively, 112) forming a partially internally reflective optical path (illustrated by arrow 114a and broken line arrow 114b, collectively, 114) along at least a portion of the length 110 of the planar waveguide 1.

The planar waveguide 1 may take a variety of forms that provide for substantially total internal reflection (TIR) for light striking the first face 112a and the second face 112b at less than a defined critical angle. The planar waveguide 1 may, for example, take the form of a pane or plane of glass, fused silica, acrylic, or polycarbonate.

The DOE 2 (illustrated in FIGS. 1 and 2 by dash-dot double line) may take a large variety of forms which interrupt the TIR optical path 114, providing a plurality of optical paths (illustrated by arrows 116a and broken line arrows 116b, collectively, 116) between an interior 118 and an exterior 120 of the planar waveguide 1 extending along at least a portion of the length 110 of the planar waveguide 1. The DOE 2 may advantageously combine the phase functions of a linear diffraction grating with that of a circular or radial symmetric zone plate, allowing positioning of apparent objects and a focus plane for apparent objects. The DOE may be formed on the surface of the waveguide or in the interior thereof.

With reference to FIG. 1, the optical coupler subsystem 104 optically couples light to the waveguide apparatus 102. Alternatively, the light may be coupled directly into the second end 108b of the waveguide if the coupler is not used. As illustrated in FIG. 1, the optical coupler subsystem may include an optical element 5, for instance a reflective surface, mirror, dichroic mirror, or prism to optically couple light into an edge 122 of the planar waveguide 1. The light can also be coupled into the waveguide apparatus through either the front or back faces. The optical coupler subsystem 104 may additionally or alternatively include a collimation element 6 that collimates light.

The control subsystem 106 includes one or more light sources and drive electronics that generate image data which may be encoded in the form of light that is spatially and/or temporally varying. As noted above, a collimation element 6 may collimate the light, and the collimated light is optically coupled into one or more planar waveguides 1 (only one waveguide is illustrated in FIGS. 1 and 2).

As illustrated in FIG. 2, the light propagates along the planar waveguide with at least some reflections or "bounces" resulting from the TIR propagation. It is noted that some implementations may employ one or more reflectors in the internal optical path, for instance thin-films, dielectric coatings, metalized coatings, etc., which may facilitate reflection. Light that propagates along the length 110 of the waveguide 1 intersects with the DOE 2 at various positions along the length 110. The DOE 2 may be incorporated within the planar waveguide 1 or abutting or adjacent to one or more of the faces 112 of the planar waveguide 1. The DOE 2 accomplishes at least two functions. First, the DOE 2 shifts an angle of the light, causing a portion of the light to escape TIR, and emerge from the interior 118 to the exterior 120 via one or more faces 112 of the planar waveguide 1. Second, the DOE 2 can also be configured to direct the out-coupled light rays to control the virtual location of an object at the desired apparent viewing distance. Thus, someone looking through a face 112a of the planar waveguide 1 can see the virtual light source as if from a specific viewing distance. As will be discussed below, in various embodiments of the invention, the illustrator can be configured to operate within or complement the DOE and waveguide technology discussed above.

Figure 3B:
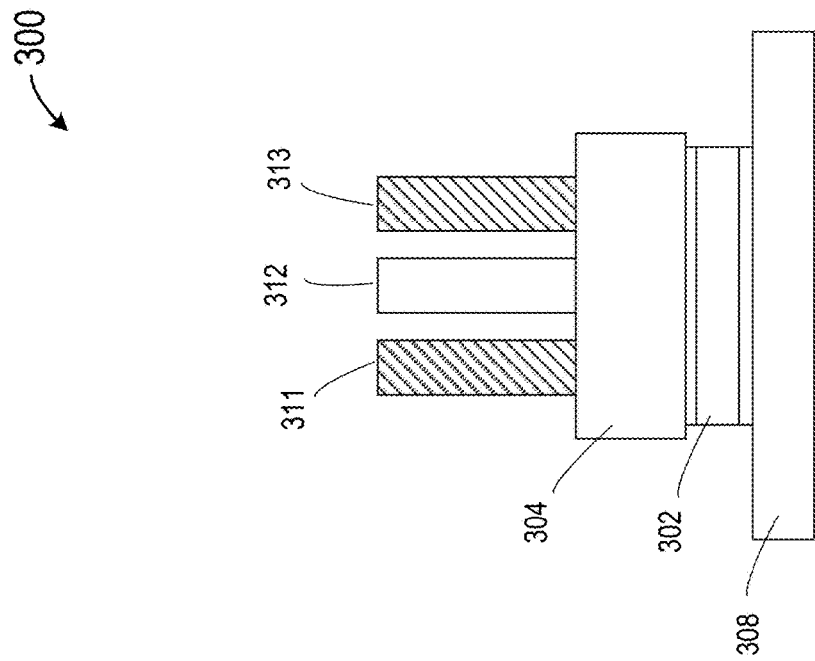
FIG. 3B is a simplified diagram illustrating a side view of the optical device of FIG. 3A according to some embodiments of the present invention.
Figure 3A:
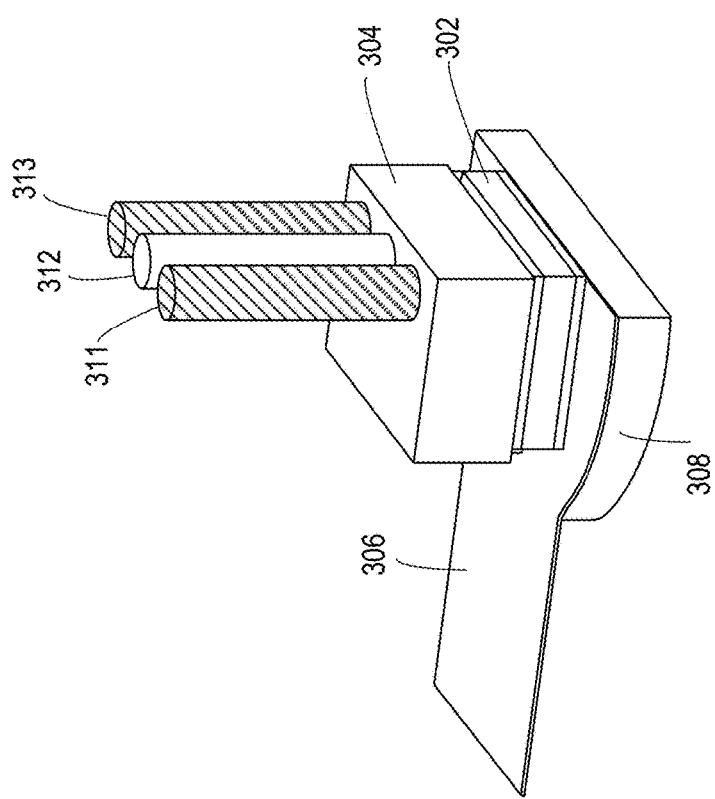
FIG. 3A is a simplified diagram illustrating a perspective view of an optical device according to some embodiments of the present invention.

FIG. 3A is a simplified diagram illustrating a perspective view of an optical device according to some embodiments of the present invention, and FIG. 3B is a simplified diagram illustrating a side view of the optical device of FIG. 3A according to some embodiments of the present invention. As described below, optical device 300 is configured to generate illumination having a plurality of wavelengths, or a plurality of colors. As shown in FIGS. 3A and 3B, optical device 300 includes a laser package 302, a collimation optics block 304, a flex connector 306, and a stiffener/heat sink 308. Laser package 302 can include diode-laser based light sources with red, green, and blue channels. In some embodiments, as illustrated in FIGS. 3A and 3B, laser package 302 is coupled to a collimation optics block 304, which may be similar to collimation element 6 described above in reference to FIGS. 1 and 2. In some embodiments, laser package 302 and collimation optics block 304 are coupled to flex connector 306 and stiffener/heat sink 308.

In some embodiments, laser package 302 is configured to output a red channel with a red light beam 311 having a wavelength of 635 nm with a tolerance of 5 nm, a green channel with a green light beam 312 having a wavelength of 520 nm with a tolerance of 5 nm, and a blue channel with a blue light beam 313 having a wavelength of 455 with a tolerance of 5 nm. In other embodiments, additional channels characterized by other wavelengths and tolerances are utilized. As a result, embodiments of the present invention are not limited to three colors. One of ordinary skill in the art would recognize many variations, modifications, and alternatives.

Figure 4A:
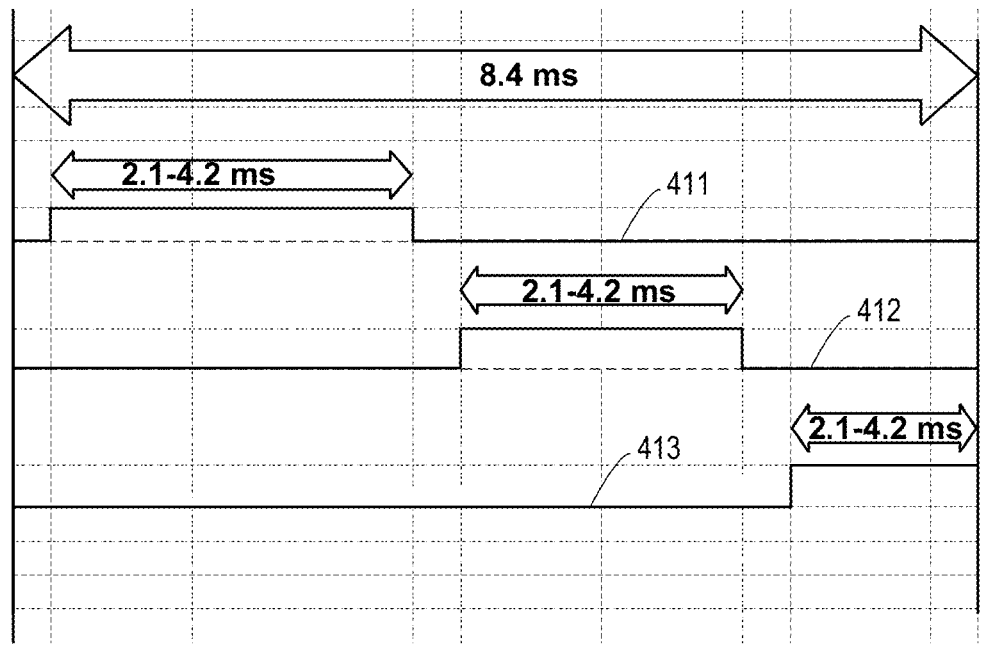
FIG. 4A is a simplified diagram illustrating a timing diagram illustrating timing cycles of different light sources providing light beams of different wavelengths according to some embodiments of the present invention.
Figure 4B:
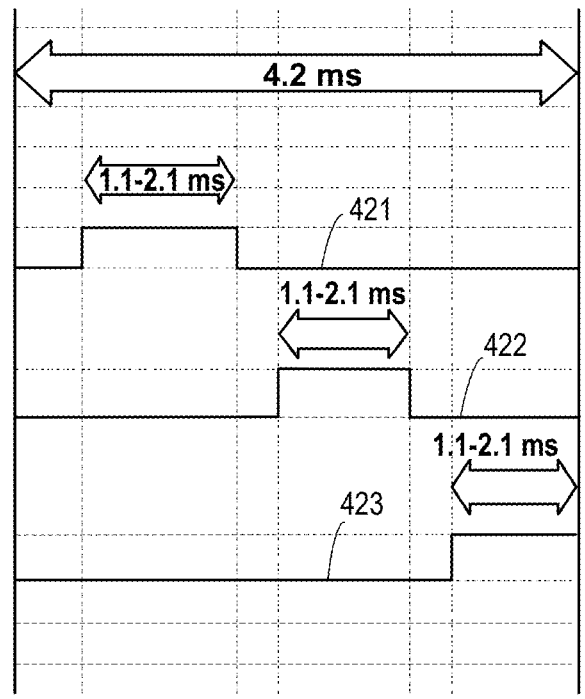
FIG. 4B is a simplified diagram illustrating a timing diagram illustrating timing cycles of different light sources providing light beams of different wavelengths according to some alternative embodiments of the present invention.

FIG. 4A is a simplified diagram illustrating a timing diagram illustrating timing cycles of different light sources providing light beams of different wavelengths according to some embodiments of the present invention, and FIG. 4B is a simplified diagram illustrating a timing diagram illustrating timing cycles of different light sources providing light beams of different wavelengths according to some alternative embodiments of the present invention. In some embodiments, laser package 302 outputs light beams from each light source per a duty factor of approximately 25% to 50% of any given channel (wherein the sum of all channels equals a duty cycle of 100%). FIGS. 4A and 4B depict exemplary timing cycles pursuant to such duty cycle parameters for various frequencies. For example, in FIG. 4A, in a period of 8.4 msec, a red light beam 411 is turned on for 2.1 to 4.2 msec, a green beam 412 is turned on for 2.1 to 4.2 msec, and a blue light beam 413 is turned on for 2.1 to 4.2 msec. In FIG. 4B, in a period of 4.2 msec, a red light beam 421 is turned on for 1.1 to 2.1 msec, a green beam 422 is turned on for 1.1 to 2.1 msec, and a blue light beam 423 is turned on for 1.1 to 2.1 msec.

FIG. 5 is a simplified diagram illustrating an example of power distribution of different light sources providing light beams of different wavelengths according to embodiments of the present invention. In some embodiments, power outputs per wavelengths of given duty cycles are configured relative to one another, such that there is variable power input to a channel based on its duty factor within the cycle. FIG. 5 illustrates an exemplary power distribution for a given duty cycle of 50% red, 25% green, and 25% blue. For example, the red light beam has a peak optical output of 130 mW, an average optical output of 65 mW, and an average electrical power of 330 mW. The green light beam has a peak optical output of 185 mW, an average optical output of 46 mW, and an average electrical power of 600 mW. The blue light beam has a peak optical output of 115 mW, an average optical output of 29 mW, and an average electrical power of 141 mW.

Figure 6:
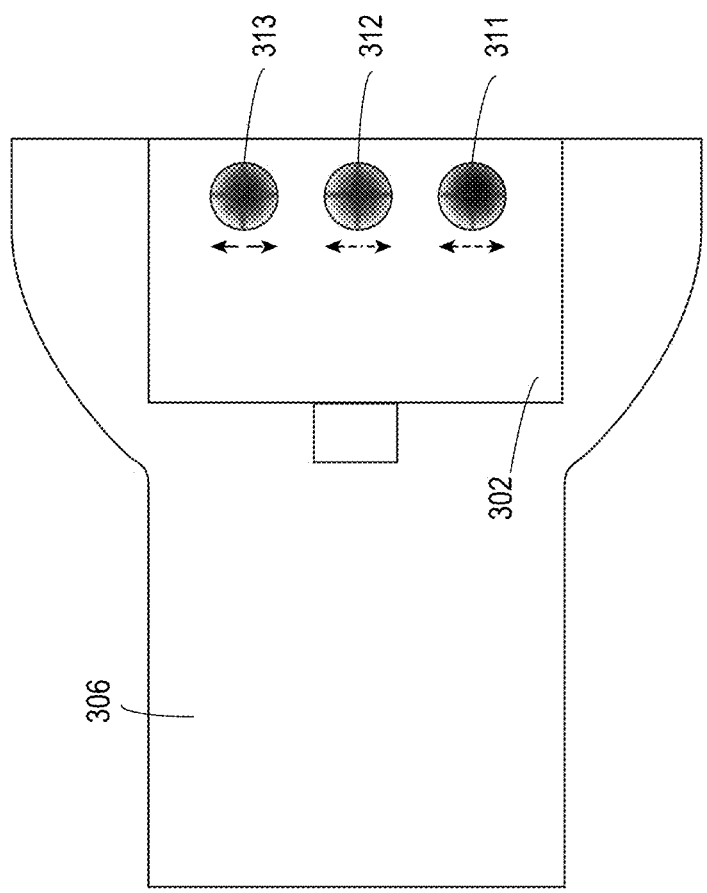
FIG. 6 is a simplified schematic diagram illustrating a top cross-sectional view of optical device 300 of FIG. 3 according to some embodiments of the present invention.

FIG. 6 is a simplified schematic diagram illustrating a top cross-sectional view of optical device 300 of FIG. 3 according to some embodiments of the present invention. FIG. 6 is a cross-sectional view of optical device 300 in FIG. 3 taken on along a plane between the collimation optics block 304 and laser package 302, or at the top surface of laser package 302. FIG. 6 shows the flex connector 306, the laser package 302, and light beams 311, 312, and 313 in FIG. 3. In some embodiments, laser package 302 is configured to substantially collimate the output of each light source at a "beam waist" where laser package 302 meets collimation optics block 304. In FIG. 6, the beam diameters of light beams 311, 312, and 313 as based on the $1/e^2$ width of each light beam. As is understood in optics, the $1/e^2$ width of a light beam is equal to the distance between the two points of the light beam on the marginal distribution that are $1/e^2=0.135$ times the maximum value of the light beam. It can be seen from FIG. 6 that the beam diameters is a factor in determining the dimensions of the optical device. Embodiments of the present invention provide a method and structure that can reduce the dimensions of the optical device.

Figures 7A, 7B:
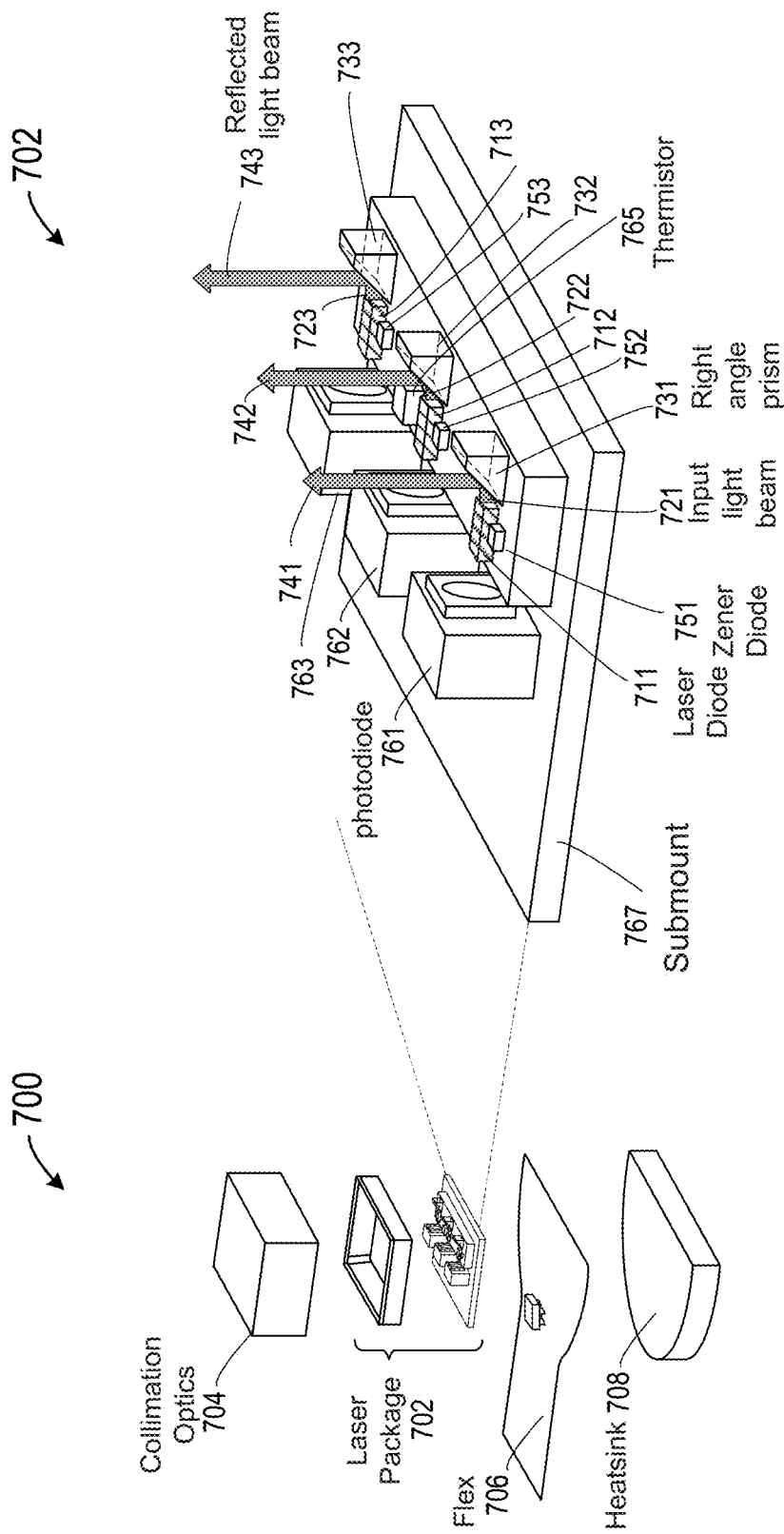
FIG. 7A is a simplified diagram illustrating an exploded view of an optical device according to some embodiments of the present invention.
FIG. 7B is a simplified diagram illustrating a perspective view of a laser package according to some embodiments of the present invention.

FIG. 7A is a simplified diagram illustrating an exploded view of an optical device 700 according to some embodiments of the present invention. It can be seen from FIG. 7A, optical device 700 includes a laser package 702, a collimation optics block 704, a flex connector 706, and a stiffener/heat sink 708, similar to optical device 300 in FIG. 3.

FIG. 7B is a simplified diagram illustrating a perspective view of the laser package 702 in FIG. 7A according to some embodiments of the present invention. Laser package 702 includes a first light source 711 for emitting a first input light beam 721, a second light source 712 for emitting a second input light beam 722, and a third light source 713 for emitting a third input light beam 723. In this example, the first light source 711 is a first laser diode, the second light source 712 is a second laser diode, and a third light source 713 is a third laser diode. Laser package 702 also includes a first right-angle prism 731 configured to receive the first input light beam 721 and provide a first reflected light beam 741, a second right-angle prism 732 configured to receive the second input light beam 722 and provide a second reflected light beam 742, a third right-angle prism 733 configured to receive the third input light beam 723 and provide a third reflected light beam 743. The first reflected light beam 741, the second reflected light beam 742, and the third reflected light beam 743 are collimated in the collimation optics block 704 as shown in FIG. 7A.

In the example of FIG. 7B, the first light source 711 is a red laser light source, the second light source 712 is a green laser light source, and the third light source 713 is a blue laser light source.

Laser package 702 can also include Zener diodes for protection of the laser diodes. For example, the first light source 711 is coupled to a first Zener diode 751, the second light source 712 is coupled to the second Zener diode 752, and the third light source 713 is coupled to a third Zener diode 753.

In some embodiments, photodiodes are used to monitor the laser diodes. For example, in FIG. 7B, a first photodiode 761 is coupled to the optical path of the first light source 711, a second photodiode 762 is coupled to the optical path of the second light source 712, and a third photodiode 763 is coupled to the optical path of the third light source 713.

In some embodiments, laser package 702 can also include a thermistor 765 to monitor temperature fluctuations or other temperature parameters in the laser package. In some embodiments, the first light source 711, the second light source 712, and the third light source 713, the first Zener diode 751, the second Zener diode 752, the third Zener diode 753, the first photodiode 761, the second photodiode 762, and the third photodiode 763, and the thermistor 765 can all be coupled to a submount 767.

Figures 8A, 8B:
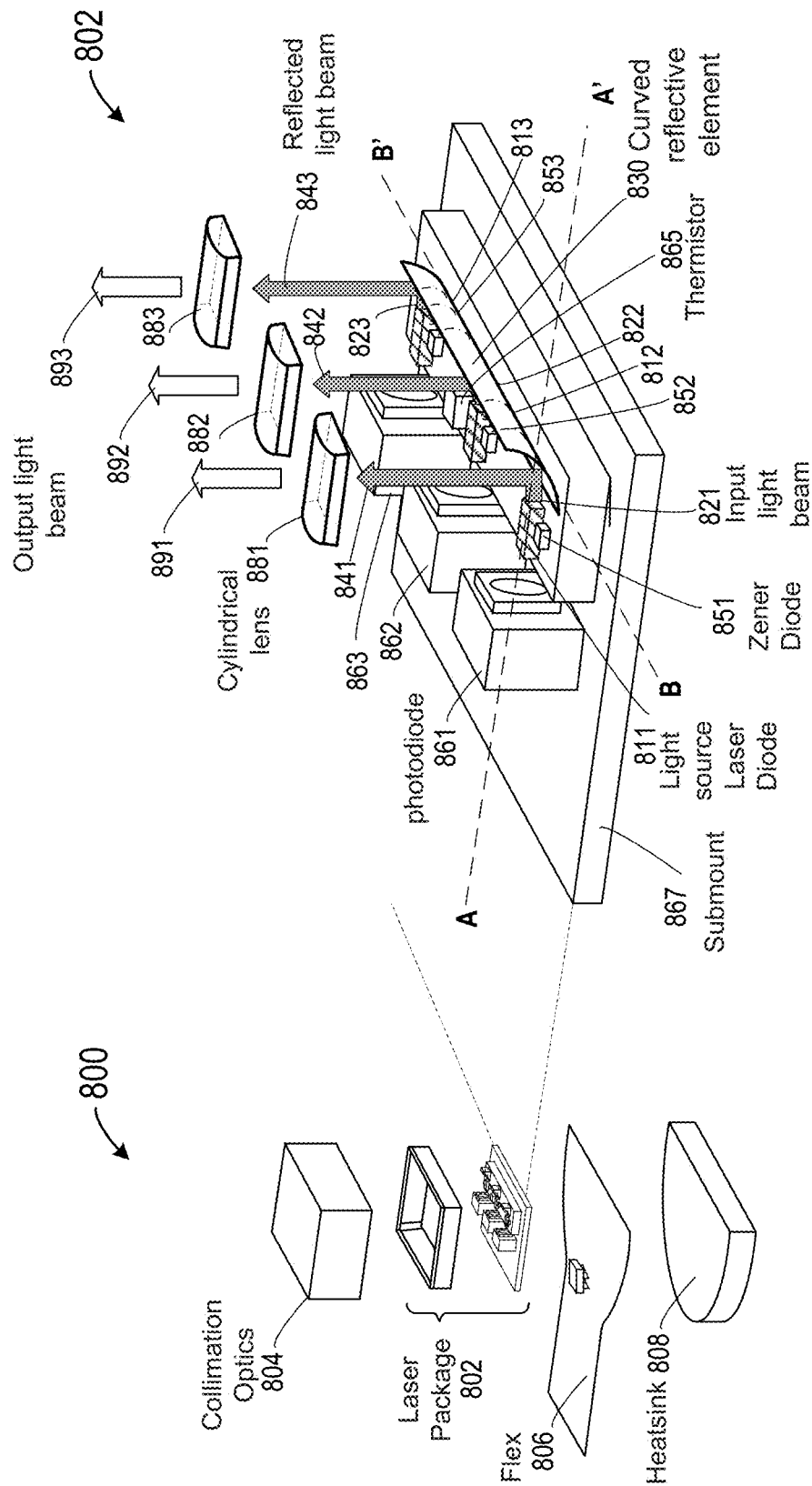
FIG. 8A is a simplified diagram illustrating an exploded view of an optical device according to some alternative embodiments of the present invention.
FIG. 8B is a simplified diagram illustrating a perspective view of a laser package according to some embodiments of the present invention.

FIG. 8A is a simplified diagram illustrating an exploded view of an optical device according to some alternative embodiments of the present invention, and FIG. 8B is a simplified diagram illustrating a perspective view of a laser package in the optical device of FIG. 8A according to some embodiments of the present invention. Optical device 800 in FIGS. 8A and 8B is similar to optical device 700 in FIGS. 7A and 7B. One difference is that the three right-angle prisms in FIG. 7B are replaced by a single curved reflective element in FIG. 8B, as described below.

As illustrated in FIG. 8A, optical device 800 includes a laser package 802, a collimation block 804, a flex connector 806, and a stiffener/heat sink 808, similar to optical device 300 in FIG. 3 and optical devices 700 in FIGS. 7A and 7B.

As illustrated in FIG. 8B, laser package 802 includes a first light source 811 for emitting a first input light beam 821, a second light source 812 for emitting a second input light beam 822, and a third light source 813 for emitting a third input light beam 823. Laser package 802 also includes a curved reflective element 830 configured to receive the first input light beam 821 and provide a first reflected light beam 841, to receive the second input light beam 822 and provide a second reflected light beam 842, to receive the third input light beam 823 and provide a third reflected light beam 843.

In some embodiments, laser package 802 can include a first cylindrical lens 881 disposed in a first light path of the first reflected light beam 841 to receive the first reflected light beam 841 and provide a first collimated output light beam 891. Laser package 802 can also include a second cylindrical lens 882 disposed in a second light path of the second reflected light beam 842 to provide a second collimated output light beam 892. Laser package 802 can also include a third cylindrical lens 883 disposed in a third light path of the third reflected light beam 843 to provide a third collimated output light beam 893.

In the example of FIG. 8B, the first light source 811 is a red laser light source, for example, a red laser diode. The second light source 812 is a green laser light source, for example, a green laser diode. The third light source 813 is a blue laser light source, for example, a blue laser diode.

Laser package 802 can also include Zener diodes for protection of the laser diodes. For example, the first light source 811 is coupled to a first Zener diode 851, the second light source 812 is coupled to a second Zener diode 852, and the third light source 813 is coupled to a third Zener diode 853.

In some embodiments, laser package 802 can also include photodiodes for monitoring the light sources, for example, laser diodes. For example, a first photodiode 861 is coupled to the optical path of the first light source 811, a second photodiode 862 is coupled to the optical path of the second light source 812, and a third photodiode 863 is coupled to the optical path of the third light source 813.

In some embodiments, laser package 802 can also include a thermistor 865 to monitor temperature fluctuations or other temperature parameters in the laser package. In some embodiments, the first light source 811, the second light source 812, and the third light source 813, the first Zener diode 851, the second Zener diode 852, the third Zener diode 853, the first photodiode 861, the second photodiode 862, and the third photodiode 863, and the thermistor 865 can all be coupled to a submount 867.

The light beams output by edge-emitting laser diodes can have different parallel and perpendicular divergence angles, also referred to as fast divergence and slow divergence angles. These asymmetric divergence angles result in an elliptical beam spot, instead of a circularly symmetric beam spot. In some embodiments, the curved reflective element 830 and the cylindrical lenses 881, 882, and 883 can provide collimation and circularization of the light beams. In contrast, conventional collimation and circularization are achieved by a combination of refractive lens (for instance, toroidal) and mirrors (rotational symmetric/off-axis parabolic or freeform), which can be more complicated and bulkier.

A cylindrical lens is a lens that focuses light into a line instead of a point as a spherical lens would. The curved face of a cylindrical lens is a section of a cylinder and can focus the image passing through it into a line parallel to the intersection of the surface of the lens and a plane tangent to it. A cylindrical lens can also be used to collimate or otherwise shape a light beam along the line of focus.

The curved reflective element 830 has a length in the longitudinal direction and a curved cross section. In the example of FIG. 8B, the fast axis of the elliptical laser light beam is perpendicular to the longitudinal direction of the curved reflective element 830. The reflected light off the curved reflective element 830 is collimated or focused in the direction perpendicular to the longitudinal direction of the curved reflective element 830, but divergent along the longitudinal direction of curved reflective element 830. The longitudinal axes of the cylindrical lenses are disposed perpendicular to the longitudinal direction of the curved reflective element 830, to collimate the reflected light in the direction parallel to the longitudinal direction of the curved reflective element 830 to produce a collimated output light that is collimated in both directions. This arrangement can result in smaller beam sizes by limiting divergence of the light beams along the light pathway.

Figures 8C, 8D:
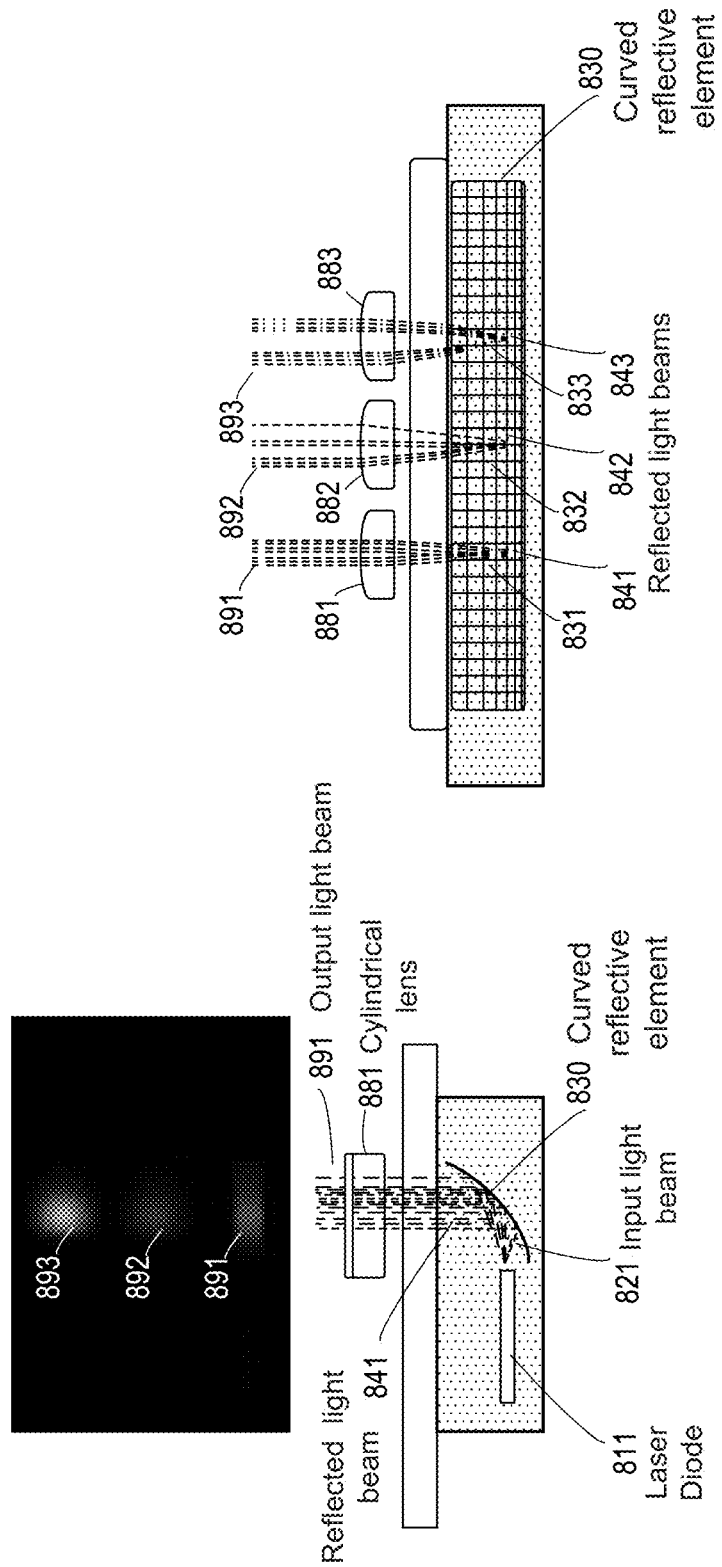
FIG. 8C is a simplified diagram illustrating a cross-sectional view of laser package 802 in FIG. 8B along Section A-A' according to some embodiments of the present invention.
FIG. 8D is a simplified diagram illustrating a cross-sectional view of laser package 802 in FIG. 8B along Section B-B' according to some embodiments of the present invention.

FIG. 8C is a simplified diagram illustrating a cross-sectional view along Section A-A' of laser package 802 in FIG. 8B according to some embodiments of the present invention. As shown in FIG. 8B, the Section A-A' is perpendicular to the longitudinal direction of the curved reflective element 830 and intersects a cross section of the curved reflective element 830. FIG. 8C shows the first light source 811 (in this example, a laser diode), curved reflective element 830, and cylindrical lens 881. FIG. 8C also shows the first input light beam 821, the first reflected light beam 841, and the first output light beam 891. It can be seen that the first input light beam 821 emitted from the first laser diode 811 is divergent as it impinges on or impacts the curved reflective element 830, and the reflected light beam 841 reflected off the curved reflective element 830 is collimated in the upward direction in FIG. 8C. Although not shown in FIG. 8C, the first cylindrical lens 881 further collimates in a perpendicular direction. In FIG. 8C, the second laser diode 812 and the third laser diode 813 are disposed behind the first laser diode 811 in the direction perpendicular to the drawing and are not visible. However, a top view of output light beams 891, 892, and 893 is shown in an upper portion of FIG. 8C.

FIG. 8D is a simplified diagram illustrating a cross-sectional view along the Section B-B' of laser package 802 in FIG. 8B according to some embodiments of the present invention. The Section B-B' extends along the longitudinal direction of the curved reflective element 830. FIG. 8D shows curved reflective element 830 and cylindrical lenses 881, 882, and 883. FIG. 8C also shows reflected light beams 841, 842, and 843 as they are reflected off the curved reflective element 830, and the reflected light beams are divergent in the longitudinal direction of the curved reflective element 830. FIG. 8D also shows output light beams 891, 892, and 893 being collimated by cylindrical lenses 881, 882, and 883.

In some embodiments, as shown in FIG. 8D, the curved reflective element 830 in laser package 802 is configured to receive the first input light beam 821 in a first region 831 of the curved reflective element 830 and provide a first reflected light beam 841, to receive the second input light beam 822 in a second region 832 and provide a second reflected light beam 842, and to receive the third input light beam 823 in a third region 833 and provide a third reflected light beam 843.

FIGS. 8A-8D illustrate an embodiment having a single curved reflective element 830 and three cylindrical lenses 881, 882, and 883. As compared with FIG. 7, which has a plurality of right angle prisms, the system of FIGS. 8A-8D illustrates a reflective element 830 that is not only a single reflective surface for all channels of laser package 802, but further has a curved surface as opposed to a linear surface or surface to reflect each channel at a common angle (e.g. 90 degrees) generally. As shown in connection to FIGS. 8A-8D, the longitudinal dimensions of the cylindrical lens are disposed perpendicular to the longitudinal direction of the curved reflective surface. This arrangement collimates the output light beams in both directions. Such a configuration enables smaller beam diameters per channel as compared to a linear reflector, such as the right angle prisms, thereby further enabling a single cylinder lens to deliver the light for each channel, as opposed to alternative optical lens necessary to support wider beam diameters that in turn may produce aberrations requiring additional optical components. Referring to FIG. 6, the dimension of the output beam diameters can determine the size of the optical device. Therefore, the optical device described in FIGS. 8A-8D can lead to a smaller device size, which is highly desirable in augmented reality applications.

In some embodiments, light beams from different light channels may impact the curved reflective element at different locations.

In some embodiments, the curved reflective element 830 has a single prescription for all channels.

In some embodiments, the curved reflective element 830 has discrete prescriptions for each individual channel's incidence location on curved reflective element 830.

In some embodiments, the curved reflective element 830 has an elliptical surface contour, such as an elliptical mirror.

In some embodiments, the curved reflective element 830 has a parabolic surface contour, such as a parabolic mirror.

In some embodiments, the curved reflective element 830 has a hyperbolic surface contour, such as a hyperbolic mirror.

In some embodiments, the curved reflective element 830 follows a prescription corresponding to the following:

$$z=cy^2/1+\sqrt{1-(1+k)c^2y^2}+\alpha_1y^2+\alpha_2y^4++\alpha_3y^6+\alpha_4y^8+\alpha_5y^{10}+\alpha_6y^{12}$$

where c is a curvature of the base radius, k is the conic constant (for parabola=−1) and coefficients alpha are polynomial aspheric coefficients. Output facet of laser may be offset in z and y to position laser at a desired focus. In some embodiments, the curvature is defined in a z-y plane and is generally constant in the x-dimension (with x-dimension being the one that spans outputs from one or more lasers). In some embodiments, x is swept through an arc. In some embodiments, the curved reflective element can have aspheric coefficient values of zero; in some embodiments, at least one aspheric coefficient is non-zero.

In some embodiments, a uniform surface finish is applied to the curved reflective element. In some embodiments, discrete surface finishing per channel incidence upon the curved reflective element is applied.

Figure 9:
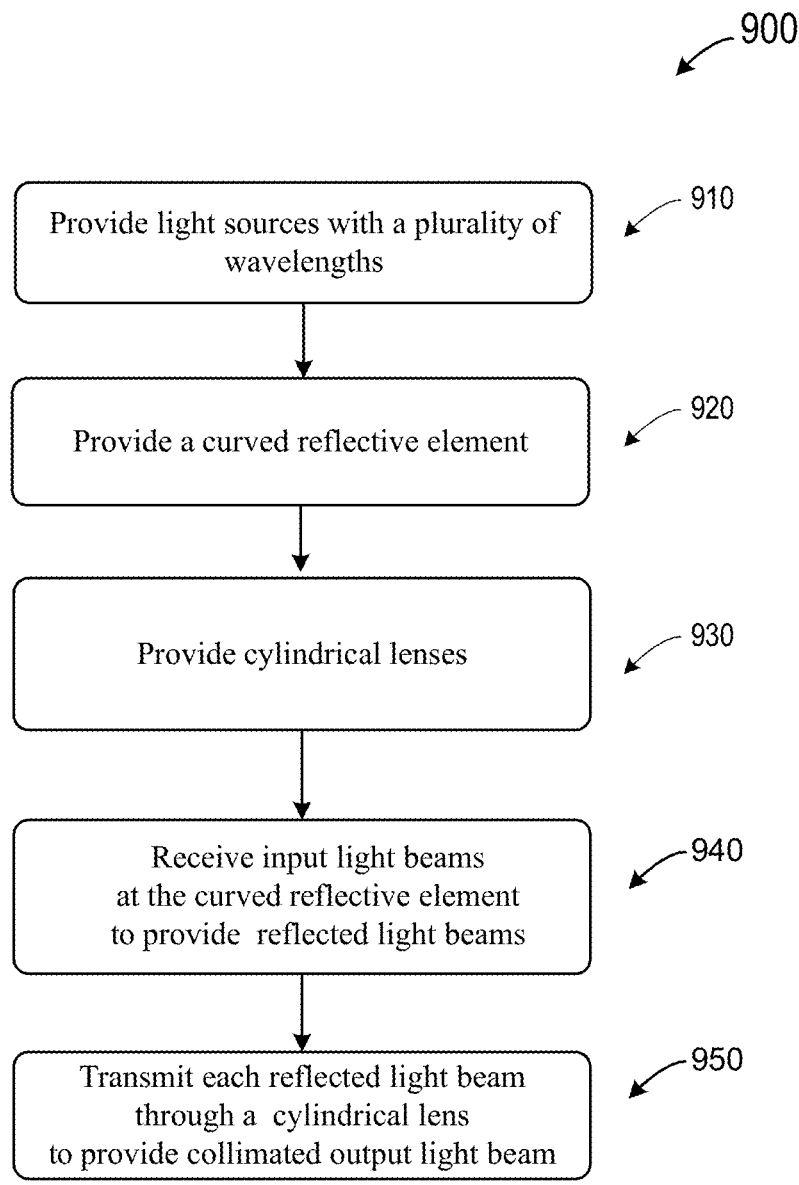
FIG. 9 is a flowchart illustrating a method for generating illumination having a plurality of wavelengths according to some embodiments of the present invention.

FIG. 9 is a flowchart illustrating a method for generating illumination having a plurality of wavelengths according to some embodiments of the present invention. As shown in FIG. 9, the method 900 can be summarized as follows:

At 910, provide light sources with a plurality of wavelengths;
At 920, provide a curved reflective element;
At 930, provide cylindrical lenses;
At 940, receive input light beams having different wavelengths from two or more light sources at the curved reflective element to provide two or more reflected light beams; and
At 950, transmit each of the two or more reflected light beams through a respective cylindrical lens to provide a corresponding collimated output light beam.

The method is described in more detail below.

At 910, the method provides light sources with a plurality of wavelengths. Examples of light sources providing a plurality of wavelengths are described above in connection with FIGS. 3A-8D. The light sources can be laser diodes providing light beams in the red, green, and blue wavelength ranges. In this embodiment, the diode-laser based light sources can have red, green, and blue channels.

At 920, the method provides a curved reflective element. An example of curved reflective element is described above in connection to FIGS. 8B-8D. Curved reflective element 830 has a longitudinal direction along its length and a curved cross section, which can have different prescriptions. For example, the curved reflective element 830 can have a single prescription for all channels. Alternatively, the curved reflective element can have discrete prescriptions in incidence locations on the curved reflective element for the first input light beam, the second input light beam, and the third input light beam. In some embodiments, the curved reflective element can have a parabolic surface contour. In some embodiments, the curved reflective element can have an elliptical surface contour. In some embodiments, the curved reflective element can have a hyperbolic surface contour. In some embodiments, the curved reflective element can have a hyperbolic contour, etc. The curved reflective element can also have a surface contour described by a mathematical equation with adjustable parameters. In some embodiments, the curved reflective element is used to collimate light beams in a cross-sectional plane perpendicular to its longitudinal direction.

At 930, the method provides cylindrical lenses. An example of cylindrical lenses is described above in connection to FIGS. 8B-8D. A cylindrical lens can focus or collimate light beams in its cross-sectional direction, while leaving the longitudinal direction unchanged. As described above in connection to FIGS. 8B-8D, cylindrical lenses 881, 882, and 883, are disposed perpendicular to the longitudinal direction of the curved reflective element 830 in such a way to collimate input light beams in two perpendicular directions. Such a configuration enables smaller beam diameters per channel as compared to a linear reflector, e.g., a right angle prism. The smaller beam diameters allow reduction of the optical device.

At 940, the method includes receiving input light beams having different wavelengths from two or more light sources at the curved reflective element to provide two or more reflected light beams. As described above in connection with FIGS. 8A-8D, the method includes receiving a first input light beam, e.g., a red light beam, from a first light source, using the curved reflective element, and providing a first, red, reflected light beam. The method also includes receiving a second input light beam, e.g., a green light beam, from a second light source using the curved reflective element, and providing a second, green, reflected light beam. The method further includes receiving a third input light beam, e.g., a blue light beam, from a third light source using the curved reflective element, and providing a third, blue, reflected light beam.

At 950, the method includes transmitting each of the two or more reflected light beams through a respective cylindrical lens to provide a corresponding collimated output light beam. With reference to FIGS. 8A-8D, the method includes transmitting the first reflected light beam through the first cylindrical lens to provide a first, e.g., red, collimated output light beam. The method also includes transmitting the second reflected light beam through the second cylindrical lens to provide a second, e.g., green, collimated output light beam. The method can also include transmitting the third reflected light beam through the third cylindrical lens to provide a third, e.g., blue, collimated output light beam.

In some embodiments, the method can also include directing the first input light beam, the second input light beam, and the third input light beam to impact the curved reflective element in different regions.

In some embodiments, the method can also include configuring the curved reflective element to have a single prescription in different regions.

In some embodiments, the method can also include configuring the curved reflective element to have discrete prescriptions in incidence locations on the curved reflective element for the first input light beam, the second input light beam, and the third input light beam.

In some embodiments, the curved reflective element has a prescription described by:

$$z=cy^2/1+\sqrt{1-(1+k)c^2y^2}+\alpha_1y^2+\alpha_2y^4++\alpha_3y^6+\alpha_4y^8+\alpha_5y^{10}+\alpha_6y^{12}$$

wherein c is a curvature of a base radius, k is a conic constant (for parabola=−1), and coefficients α are polynomial aspheric coefficients.

In some embodiments, the method can include applying a uniform surface finish to the curved reflective element, or applying a discrete surface finishing in each region of the curved reflective element.

While the preferred embodiments of the invention have been illustrated and described, it will be clear that the invention is not limited to these embodiments only. Numerous changes, modifications, variations, substitutions and equivalents will be apparent to those skilled in the art without departing from the spirit and scope of the invention as described in the claims.

What is claimed is:

1. An optical device comprising:
a first light source for emitting a first input light beam;
a second light source for emitting a second input light beam;
a third light source for emitting a third input light beam;
a curved reflective element configured to:
  receive the first input light beam and provide a first reflected light beam;
  receive the second input light beam and provide a second reflected light beam; and
  receive the third input light beam and provide a third reflected light beam;
a first cylindrical lens disposed in a first light path of the first reflected light beam and configured to receive the first reflected light beam and provide a first collimated output light beam;
a second cylindrical lens disposed in a second light path of the second reflected light beam and configured to receive the second reflected light beam and provide a second collimated output light beam;
a third cylindrical lens disposed in a third light path of the third reflected light beam and configured to receive the third reflected light beam and provide a third collimated output light beam; and
a planar waveguide positioned to receive the first collimated output light beam, the second collimated output light beam, and the third collimated output light beam.

2. The optical device of claim 1, wherein:
the first light source comprises a red laser light source;
the second light source comprises a green laser light source; and
the third light source comprises a blue laser light source.

3. The optical device of claim 1, wherein the first input light beam, the second input light beam, and the third input light beam are configured to impinge on the curved reflective element in different regions.

4. The optical device of claim 1, wherein the curved reflective element has a single prescription in different regions.

5. The optical device of claim 1, wherein the curved reflective element is configured to have discrete prescriptions in incidence locations on the curved reflective element for the first input light beam, the second input light beam, and the third input light beam, respectively, wherein at least one of the discrete prescriptions differs from another one of the discrete prescriptions.

6. The optical device of claim 1, wherein the curved reflective element has a parabolic surface contour.

7. The optical device of claim 1, wherein the curved reflective element has a prescription described by:

$$z = cy^2/1 + \sqrt{1-(1+k)c^2y^2} + \alpha_1 y^2 + \alpha_2 y^4 + \alpha_3 y^6 + \alpha_4 y^8 + \alpha_5 y^{10} + \alpha_6 y^{12}$$

wherein c is a curvature of a base radius, k is a conic constant (for parabola=−1), and coefficients α are polynomial aspheric coefficients.

8. The optical device of claim 1, wherein the curved reflective element has a discrete surface finish in each region of the curved reflective element.

9. An optical device, comprising:
two or more light sources configured for providing input light beams having different wavelengths;
a curved reflective element configured to receive the input light beams to provide two or more reflected light beams;
a cylindrical lens for each of the reflected light beams configured to transmit a respective one of the reflected light beams to provide a corresponding collimated output light beam; and
a planar waveguide positioned to receive each collimated output light beam.

10. The optical device of claim 9, wherein:
a first light source comprises a red laser light source;
a second light source comprises a green laser light source; and
a third light source comprises a blue laser light source.

11. The optical device of claim 9, wherein each of the input light beams is configured to impinge on the curved reflective element in different regions.

12. The optical device of claim 9, wherein the curved reflective element is configured to have discrete prescriptions in incidence locations on the curved reflective element for each of the input light beams, wherein at least one of the discrete prescriptions differs from another one of the discrete prescriptions.

13. The optical device of claim 9, wherein the curved reflective element has a prescription described by:

$$z = cy^2/1 + \sqrt{1-(1+k)c^2y^2} + \alpha_1 y^2 + \alpha_2 y^4 + \alpha_3 y^6 + \alpha_4 y^8 + \alpha_5 y^{10} + \alpha_6 y^{12}$$

wherein c is a curvature of a base radius, k is a conic constant (for parabola=−1), and coefficients α are polynomial aspheric coefficients.

14. The optical device of claim 9, wherein the curved reflective element has a discrete surface finishing in each region of the curved reflective element.

15. A method for generating illumination having a plurality of wavelengths, comprising:
providing a curved reflective element;
providing two or more cylindrical lenses;
receiving input light beams having different wavelengths from two or more light sources at the curved reflective element to provide two or more reflected light beams;
transmitting each of the two or more reflected light beams through a respective cylindrical lens to provide a corresponding collimated output light beam; and
directing each collimated output light beam into a planar waveguide.

16. The method of claim 15, further comprising:
emitting a red light beam from a first light source;
emitting a green light beam from a second light source; and
emitting a blue light beam from a third light source.

17. The method of claim 15, further comprising directing each of the input light beams to impinge on the curved reflective element in different regions.

18. The method of claim 15, further comprising configuring the curved reflective element to have discrete prescriptions in incidence locations on the curved reflective element for each of the input light beams, wherein at least one of the discrete prescriptions differs from another one of the discrete prescriptions.

19. The method of claim 15, wherein the curved reflective element has a prescription described by:

$$z = cy^2/1 + \sqrt{1-(1+k)c^2y^2} + \alpha_1 y^2 + \alpha_2 y^4 + \alpha_3 y^6 + \alpha_4 y^8 + \alpha_5 y^{10} + \alpha_6 y^{12}$$

wherein c is a curvature of a base radius, k is a conic constant (for parabola=−1), and coefficients α are polynomial aspheric coefficients.

20. The method of claim 15, further comprising applying a discrete surface finishing in each region of the curved reflective element.

* * * * *